United States Patent
DeLeon et al.

(10) Patent No.: US 8,660,163 B2
(45) Date of Patent: Feb. 25, 2014

(54) AMPLIFICATION OF LONG-RANGE SURFACE PLASMONS WITH REDUCED NOISE

(75) Inventors: Israel DeLeon, Ottawa (CA); Pierre Berini, Ottawa (CA)

(73) Assignee: University of Ottawa, Ottawa, Ontario (CA)

( * ) Notice: Subject to any disclaimer, the term of this patent is extended or adjusted under 35 U.S.C. 154(b) by 114 days.

(21) Appl. No.: 13/432,630

(22) Filed: Mar. 28, 2012

(65) Prior Publication Data

US 2012/0250720 A1  Oct. 4, 2012

Related U.S. Application Data (60) Provisional application No. 61/468,346, filed on Mar. 28, 2011.

(51) Int. Cl.
   *H01S 3/14*  (2006.01)
   *H01S 3/08*  (2006.01)

(52) U.S. Cl.
   USPC ............................................. 372/98; 372/39

(58) Field of Classification Search
   USPC ................ 372/39, 53, 55, 54, 70, 98, 108; 359/342, 344
   See application file for complete search history.

(56) References Cited

U.S. PATENT DOCUMENTS 7,043,134 B2   5/2006   Berini et al.

OTHER PUBLICATIONS

Israel DeLeon et al "Theory of Surface Plasmon-Polariton Amplification in Planar Structures Incorporating Dipolar Gain Media", Physical Review B 78,16401, 2008.
Israel DeLeon et al "Modeling Surface Plasmon-Polariton Gain in Planar Metallic Structures", Optics Express, vol. 17, No. 22, Oct. 26, 2009.

*Primary Examiner* — Armando Rodriguez
(74) *Attorney, Agent, or Firm* — Harness, Dickey & Pierce, PLC (57) ABSTRACT

An optical amplifier suitable for coherently amplifying surface plasmon-polariton waves with high gain and low noise over visible and infrared wavelengths. The optical amplifier is comprised of a thin strip of material having a complex permittivity with a negative real part, in contact on at least one side with an optical gain medium, where the strip has finite width and thickness such that optical radiation couples to the strip and propagates along its length as a surface plasmon-polariton wave. The surface plasmon-polariton amplifier can also be incorporated into a resonant cavity to form a plasmon-polariton laser.

23 Claims, 11 Drawing Sheets

AMPLIFICATION OF LONG-RANGE SURFACE PLASMONS WITH REDUCED NOISE

CROSS-REFERENCE TO RELATED APPLICATIONS

This application claims the benefit of U.S. Provisional Application No. 61/468,346, filed on Mar. 28, 2011. The entire disclosure of the above application is incorporated herein by reference.

FIELD

The present disclosure relates to optical amplification devices and specifically to amplification devices based on the amplification of surface plasmon-polariton waves at wavelengths in the visible and infrared range.

BACKGROUND

Surface plasmon-polaritons, referred herein simply as plasmon-polaritons, are transverse-magnetic (TM) polarized electromagnetic surface waves coupled to free electron oscillations at the interface between a dielectric characterized by a (possibly complex) permittivity with positive real part and a medium (typically a metal) characterized by a permittivity with negative real part (e.g., Au, Ag, Cu, and Al at visible and infrared wavelengths). Plasmon-polaritons exhibit interesting properties that find applications in a broad range of scientific fields. However, a fundamental problem that imposes limitations to many of these applications is the large propagation loss of plasmon-polaritons at visible and near-infrared wavelengths, which results from energy dissipation in the media in which they propagate.

The amplification of plasmon-polariton waves has been proposed as a route to mitigate or even eliminate their intrinsic losses, and considerable effort has been devoted to demonstrate amplification and lasing with plasmon-polaritons.

This section provides background information related to the present disclosure which is not necessarily prior art.

SUMMARY

In one aspect of the present disclosure there is provided an optical amplifier, suitable for amplifying optical radiation in the form of plasmon-polariton waves, comprising: a thin strip of a material having a complex relative permittivity with negative real part surrounded by materials having a (possibly) complex relative permittivity with positive real part, the strip having finite width (w) and thickness (t) with dimensions such that optical radiation having wavelength in a predetermined range couples to the strip and propagates along its length as a plasmon-polariton wave, and where at least one of the materials surrounding the strip provides optical gain such that the plasmon-polariton wave supported by the strip undergoes amplification as it propagates along the length of the strip; means for pumping the amplifier consisting of at least one pump source suitable for pumping the gain medium, and at least one pump interfacing element for channeling the pump energy into such a gain medium; an input port through which an input optical signal is coupled into the strip generating a plasmon-polariton wave that propagates along its length, and an output port through which the plasmon-polariton wave is coupled out the strip; means for input optical coupling consisting of an optical mode-matching element designed to optimize the coupling efficiency of the input optical signal into the input port of the waveguide structure by ensuring that the modal properties of the input optical signal are as similar as possible to the modal properties of the plasmon-polariton mode supported by the waveguide structure, specifically ensuring that the transverse field intensity distributions of the two modes are well matched and polarization states are substantially aligned; and means for output signal coupling consisting of an optical mode-matching element designed to optimize the coupling efficiency of the plasmon-polariton mode at the output port of the waveguide structure into the input port of a subsequent optical system.

In some embodiments, when the gain medium is in fluid form, the amplifier design might include a fluidic channel as means to confine the fluid in the device and to enable fluid circulation if so required.

In some embodiments, the plasmon-polariton amplifier can be incorporated into a resonant cavity supporting at least one longitudinal mode with a wavelength that overlaps efficiently with the plasmon-polariton amplifier's gain spectrum, such that the gain provided by the plasmon-polariton amplifier is larger than the losses of the resonant cavity, in which case, the device becomes a source of highly polarized coherent optical radiation (i.e, plasmon-polariton laser).

This section provides a general summary of the disclosure, and is not a comprehensive disclosure of its full scope or all of its features. Other advantages and features of the present disclosure will be readily apparent from the following drawings, detailed description, examples of embodiments, and claims. Further areas of applicability will become apparent from the description provided herein. The description and specific examples in this summary are intended for purposes of illustration only and are not intended to limit the scope of the present disclosure.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

To facilitate an understanding of the ensuing description of the operation of exemplary embodiments of the disclosure, a new theory of optical gain and noise in photon and plasmon-polariton amplifiers will be provided. An optical amplifier is an optical device capable of amplifying coherently optical radiation (e.g., photons, plasmon-polaritons). The device consists of an optical structure that incorporates a medium with optical gain, which allows an optical amplification process such as stimulated emission. The gain medium itself must be excited in order for it to provide optical gain; this process is called pumping and involves transferring energy from an energy source to the gain medium via an optical, electrical or chemical process.

An optical amplifier has input and output ports. In such a device, an optical signal is fed into the input port such that it propagates through the structure interacting with the gain medium and undergoes optical amplification before it is extracted from the device through the output port. The gain of an optical amplifier, G, is simply defined as the ratio of the output signal power to input signal power. The noise, on the other hand, is typically quantified by the optical noise figure, $F_o$, which is the ratio of the signal-to-noise ratio at the output port to the signal-to-noise ratio at the input port. An analysis of optical noise figure in photon and plasmon-polariton amplifiers is presented next assuming a dipolar gain medium. It is envisioned that the analysis may be extended to plasmon-polariton amplifiers having other types of gain mediums.

Beginning with the definition of optical noise figure $$F_o = \frac{1+2\eta}{G} + \frac{M\eta^2}{G^2 \langle n(0) \rangle} + \frac{M\eta}{G^2 \langle n(0) \rangle} \quad (1)$$

where $$G = \exp(\gamma l_G) \quad (2)$$

is the optical gain of the amplifier with $\gamma$ being the mode power gain coefficient and $l_G$ being the amplifier length, M is the number of modes supported by the amplifier, $\eta$ is the amplified spontaneous emission (ASE) photon number distributed into all the supported modes, and $\langle n(0) \rangle$ is the signal's mean photon number at the input of the amplifier. The first term is associated with the signal's shot noise and beat noise, the second is associated with the ASE beat noise, and the third is associated with the ASE shot noise. However, when the input signal is large enough such that $G < n(0) >>> \eta$, Eq. (1) becomes $$F_o = \frac{1+2\eta}{G} \quad (3)$$

In general, the ASE power in an optical amplifier can be expressed as $$P_N = Ah\nu_0 \frac{\xi}{\gamma}[G-1] \quad (4)$$

where A is the mode area, h is Plank's constant, $\nu_0$ is the optical frequency and $\xi$ is the spontaneous emission rate per unit volume. The ASE photon number, $\eta$, is related to the ASE power through $$\eta = P_N(B_\nu h\nu_0)^{-1}, \quad (5)$$

with $B_\nu$ being the optical detection bandwidth centered around $\nu_0$. Thus, using Eq. (4) and (5) into (3) one obtains $$F_o = \frac{1}{G} + \frac{2\xi}{\gamma} \cdot \frac{A}{B_\nu}\left(\frac{G-1}{G}\right) \quad (6)$$

Then, for a large optical gain, $G >> 1$, the noise figure approaches $$F_o = \frac{2\xi}{\gamma} \cdot \frac{A}{B_\nu} \quad (7)$$

A reference optical amplifier is the Gaussian amplifier, which amplifies a Gaussian beam or Gaussian mode. Many amplifiers and lasers are based on Gaussian modes because they are well behaved and have low divergence. Furthermore, a Gaussian amplifier can be viewed as a single mode amplifier.

The spontaneous emission rate of dipoles in a single mode photon amplifier (e.g., a Gaussian optical amplifier) can be written as $$\xi = Ng(\nu)B_\nu \Gamma F, \quad (8)$$

where N is the dipole population density in the excited state, $g(\nu)$ is the lineshape function, $\Gamma$ is the spontaneous emission rate into the amplified mode and F is the fraction of wavevector components supported by such a mode along the forward propagation direction. In a Gaussian photon amplifier $$\Gamma = \Gamma_0 = \frac{q}{\tau_f}, \quad (9)$$

is the radiative decay rate with q and $\tau_f$ being the dipole's quantum efficiency and dipole's fluorescence lifetime (or excited state lifetime), respectively, and $$F = \frac{\lambda_0^2}{4\pi^2 w_0^2 \varepsilon_d} \quad (10)$$

where $\lambda_0 = c\nu_0^{-1}$ is the wavelength in vacuum (c being the speed of light in vacuum), $\varepsilon_d$ is the real part of the gain medium's permittivity, and $w_0$ is the beam waist. Furthermore, assuming that the amplifier losses are characterized by α, the effective dipole excited state population density is represented as $$N = (\gamma + \alpha)\frac{1}{\sigma_e(v_0)} = (\gamma + \alpha)\frac{8\pi\varepsilon_d}{\Gamma_0\lambda_0^2 g(v_0)}, \quad (11)$$

where $\sigma_e(v_0)$ is the dipole's emission cross-section evaluated at $v_0$. Thus using Eqs. (9), (10), and (11) into (8) one obtains $$\xi = \frac{1}{2}(\gamma + \alpha)\frac{2}{\pi w_0^2}\frac{g(v)B_v}{g(v_0)} \quad (12)$$

The factor of ½ at the front was included to account for only one of the two possible polarization states supported by the Gaussian photon amplifier. For a narrow detection optical bandwidth, $B_v$, centered around $v_0$ and defining the effective Gaussian mode area as $A=\pi w_0^2$ one obtains $$\xi = (\gamma + \alpha) \cdot \frac{B_v}{A}. \quad (13)$$

From Eqs. (13) and (7) one obtains the noise figure of a high gain Gaussian photon amplifier as $$F_o = 2\left(\frac{\gamma + \alpha}{\gamma}\right). \quad (14)$$

Clearly, for $\gamma \gg \alpha$, Eq. (14) approaches the minimum value $F_o=2$ or 3 dB.

Similarly, one can define an optical noise figure for a plasmon-polariton amplifier that supports a plasmon-polariton mode with Gaussian profile in the material-interface plane. For this consider a thin film (infinitely wide strip) supporting a Gaussian plasmon-polariton mode incorporating a dipolar gain medium on both sides of the film.

The spontaneous emission rate into such a Gaussian plasmon-polariton mode can also be described by Eq. (8). As for the Gaussian beam amplifier, Eq. (11) is used to describe the excited state dipole density; however, in this case α is the intrinsic mode power attenuation coefficient of the plasmon-polariton. Furthermore, the product ΓF represents the average spontaneous emission rate into the plasmon-polaritons propagating in the forward direction. Following the teachings of DeLeon and Berini in "Spontaneous emission in long-range surface plasmon-polariton amplifiers" Phys. Rev. B. vol. 83, 081414R (2011), define $$\Gamma = \frac{1}{\delta}\int_0^\infty dy \Gamma_P(y), \quad (15)$$

with δ being the $e^{-1}$ plasmon-polariton field penetration depth into the gain medium and $\Gamma_P(y)$ being the position dependent spontaneous emission rate into plasmon polaritons propagating in all directions. The latter can be obtained as $$\Gamma_P(y) = Re\Gamma_0\int_{u_1}^{u_2} du S_d(u,y), \quad (16)$$

where u is the normalized in-plane wave vector and the integral runs over the range of in-plane wave-vectors $(u_1, u_2)$ associated with the plasmon-polariton mode. The integrand in Eq. (16)

$$S_d(u,y) = \frac{u}{2\sqrt{1-u^2}}[u^2 R_P^+(u,y) + (1-u^2)R_P^-(u,y) + R_S^+(u,y)] \quad (17)$$

is the normalized power dissipation density of a dipole located at a distance y from the film's surface upon which the dipole is emitting, where $$R_{P,S}^\pm(u,y) = 1 \pm r_{P,S}\exp(2iyk\sqrt{1-u^2}), \quad (18)$$

with $k=\in_d^{1/2}\omega/c$ being the wave-vector in the medium surrounding the film, and $r_P$ and $r_S$ being the Fresnel coefficients at the film surface upon which the dipole is emitting.

The factor F for a Gaussian plasmon-polariton is $$F = \frac{\lambda_0}{\pi^2 w_0 n_{eff}} \quad (19)$$

where $n_{eff}$ is the effective index of the plasmon-polariton mode, and $w_0$ is the plasmon-polariton "beam" waist. Then, substituting equations (15)-(19), and (11) into (8), and assuming a narrow detection optical bandwidth, $B_v$, centered around $v_0$ one obtains $$\xi = (\gamma + \alpha)\frac{16\varepsilon_d}{\pi\lambda_0 n_{eff}}\frac{B_v}{A}\int_{-\infty}^{+\infty}dy\left(\text{Re}\int_{u_1}^{u_2}du S_d(u,y)\right), \quad (20)$$

where $A=4w_0\delta$ is approximately the area of the plasmon-polariton mode (neglecting the field in the metal region). In equation (20), both $n_{eff}$ and the integration of $S_d(u,y)$ cannot be obtained analytically. Thus, for the LRSPP, ξ must be evaluated numerically.

Finally, from Eqs. (20) and (7) one obtains the noise figure of a high gain Gaussian plasmon-polariton amplifier as $$F_o = 2S_0\left(\frac{\gamma + \alpha}{\gamma}\right), \quad (21)$$

with $$S_0 \frac{8\varepsilon_d}{\sqrt{\pi}\,\lambda_0 n_{eff}}\int_{-\infty}^{+\infty}dy\left(\text{Re}\int_{u_1}^{u_2}du S_d(u,y)\right) \quad (22)$$

Figure 1:
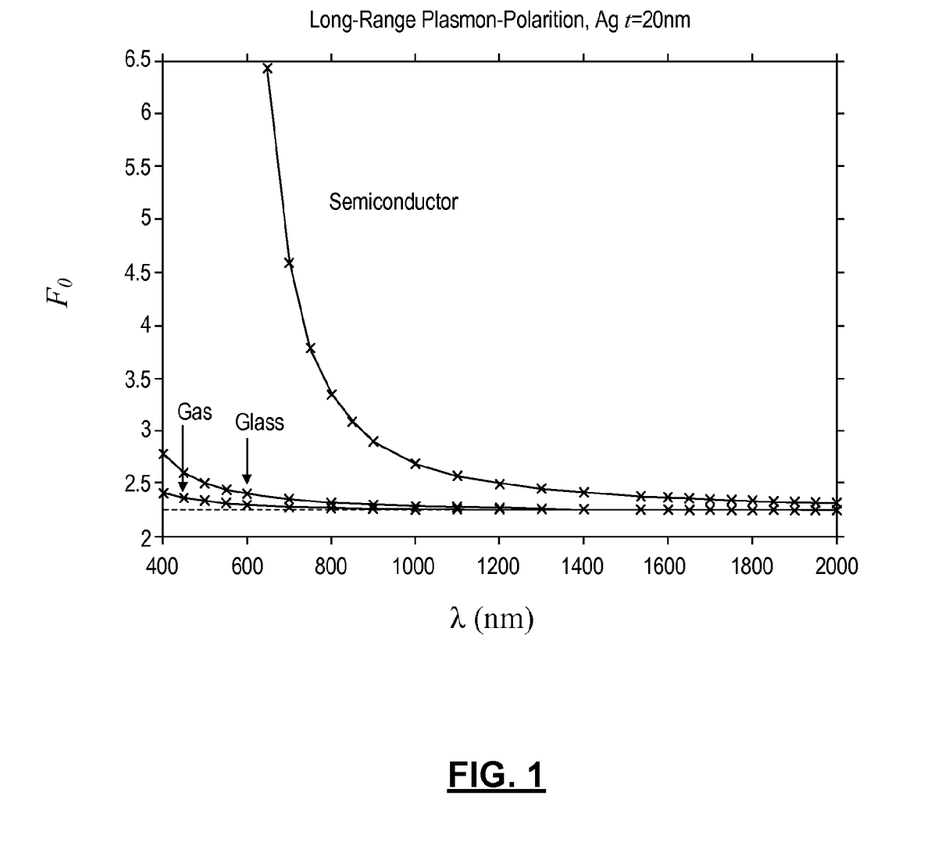
FIG. 1 is a graph that shows numerical calculations of optical noise figure in a Gaussian long-range plasmon-polariton amplifier for three different gan media (gaseous, doped glass, semiconductor).

For $\gamma \gg \alpha$, equation (21) approaches the minimum value $F_o=2S_0$. FIG. 1 shows $F_o$ as a function of the wavelength for a high gain Gaussian plasmon-polariton amplifier consisting of a 20 nm Ag film bounded by a dipolar gain medium. Three different dipolar gain media are considered: a gaseous gain medium ($\in_d=1$), a polymer gain medium ($\in_d=2.25$), and a semiconductor gain medium ($\in_d=13.8$). For all the cases, the permittivity of Ag was estimated using the Drude model. Note that for long wavelengths $F_o$ approaches to $4/(\pi)^{1/2} \approx 2.25$ (indicated by the dashed line), which is slightly higher than the noise figure of a Gaussian photon amplifier.

Plasmon-polariton modes in finite width structures, such as strips having widths much greater than its thickness, often exhibit a Gaussian field profile along the strip width as described by P. Berini in "Plasmon polariton waves guided by thin lossy metal films of finite width: Bound modes of symmetric structures," Phys. Rev. B, vol. 61, 10484 (2000). Thus, the present theory is applicable to such structures. In following sections, the theory developed here will be used to evaluate the noise performance of specific embodiments supporting the Gaussian-like plasmon-polariton modes. It is also envisioned that this theory may be extended to plasmon-polariton modes having non-Gaussian modes.

Before describing the exemplary embodiments, various terms are described in the manner in which they are used in this disclosure. The terms "finite" and "infinite" as used herein are understood by persons skilled in this art to distinguish between waveguides having "finite" widths in which the actual width is significant to the performance of the waveguide and the physics governing its operation and so-called "infinite" waveguides where the width (or thickness) is so great that it has no significant effect upon the performance of the waveguide or the operation thereof.

The term "optical gain medium" and "gain medium" as used herein is understood by persons skilled in the art to describe an optically active material capable of amplifying optical radiation over a predetermined wavelength range.

The terms "plasmon-polariton" and "optical mode" used herein refer to the main long-range surface plasmon-polariton wave supported by the strip.

The term "mode-matching" as used herein means making two optical modes as similar to each other as possible; specifically ensuring that the transverse field intensity distributions are well matched and polarization states are substantially aligned.

Figure 2:
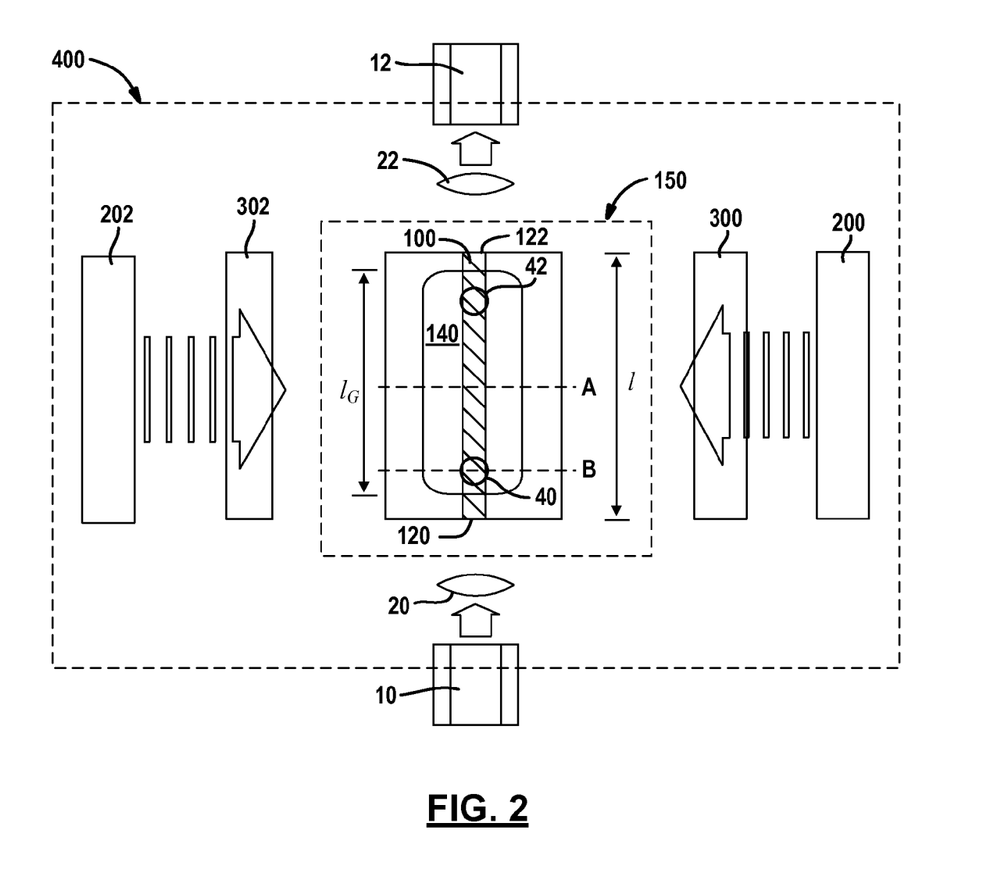
FIG. 2 is a diagram depicting a first exemplary embodiment of a plasmon-polariton amplifier in which the gain medium is a fluid pumped optically.
Figure 3A:
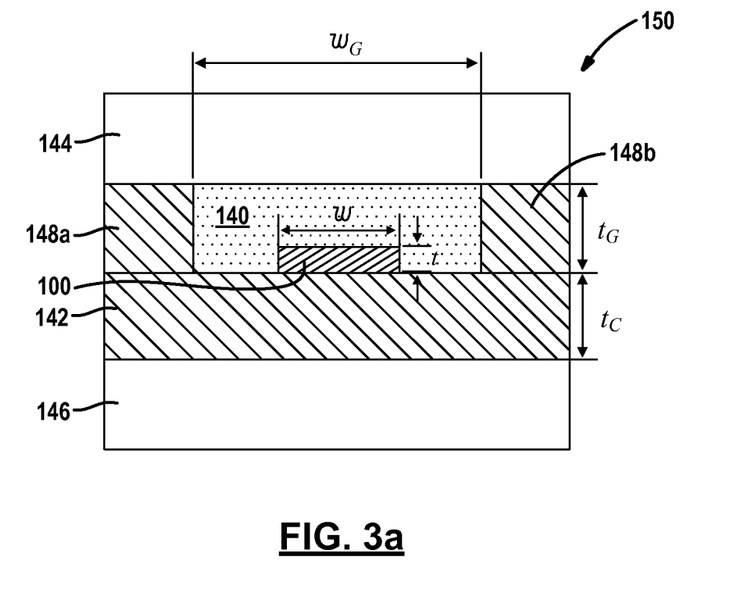
FIG. 3a is a cross-sectional view of the amplifier taken along a transverse cut A as specified in FIG. 2.
Figure 3B:
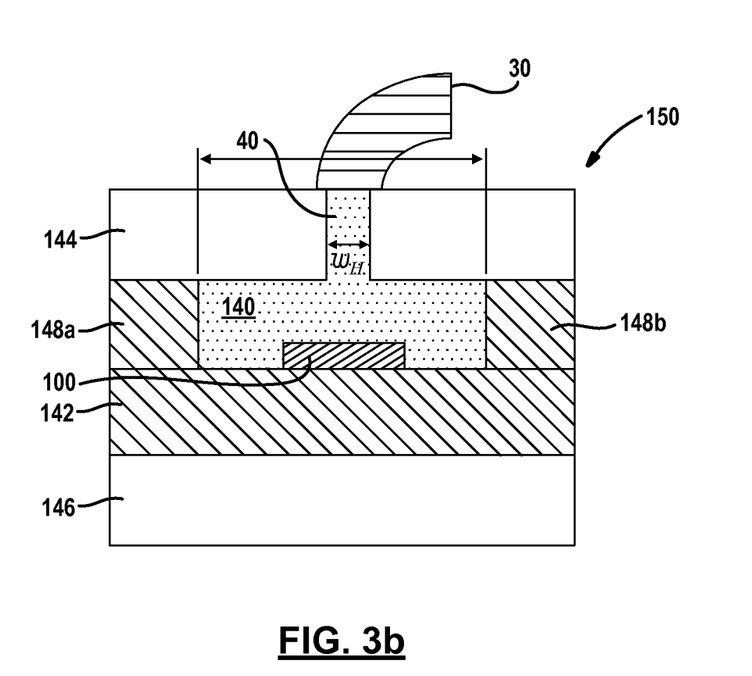
FIG. 3b is a cross-sectional view of the amplifier taken along a transverse cut B as specified in FIG. 2.

FIGS. 2, 3a and 3b depict a first exemplary embodiment of an optical amplifier 400. The plasmon-polariton amplifier 400 is comprised generally of an input coupling 10, a waveguide structure 150, and an output coupling 12. The amplifier may further include optical pump sources 200 and 202, pump interfacing elements 300 and 302, as well as input and output mode-matching elements 20 and 22. Each of these components is further described below.

The input coupling 10 enables the amplifier to receive an optical radiation signal; whereas, the output coupling 12 delivers the amplified optical signal to a subsequent processing stage. The input coupling 10 and output coupling 12 may take the form of polarization maintaining optical waveguides, which can include (but are not limited to) polarization maintaining fibers, stressed dielectric waveguides, and plasmon-polariton waveguides. Standard single-mode fibres may also be used. Other forms for the couplings are also contemplated by this disclosure.

The input optical mode-matching element 20 is designed to optimize the coupling efficiency of the input optical signal into the input port 120 of the waveguide structure 150 by ensuring that the modal properties of the input optical signal are as similar as possible to the modal properties of the plasmon-polariton mode supported by the waveguide structure 150, specifically ensuring that the transverse field intensity distributions of the two modes are well matched and polarization states are substantially aligned. Similarly, the output optical mode-matching element 22 is designed to optimize the coupling efficiency of the plasmon-polariton mode at the output port 122 of the waveguide structure into the output coupling 12.

The waveguide structure 150 comprises a strip 100 of finite width w and thickness t and dimensioned such that optical radiation at predetermined wavelengths couple to the strip and propagate along its length as a plasmon-polariton wave. Wavelengths of interest include wavelengths from about 300 nm to the infrared, especially wavelengths near 800 nm, optical telecommunication wavelengths, and wavelengths near 1310 nm and 1550 nm although the concepts set forth herein may be extended to optical radiation having other wavelengths. Further details regarding an exemplary waveguide structure may be found, for example, in U.S. Pat. No. 6,442,321.

The strip 100 is comprised of material having a complex relative permittivity with negative real part. The strip 100 is bounded on the bottom by a material 142 having a (possibly) complex relative permittivity with positive real part, and bounded on the top and sides by a fluid gain medium 140 having a complex relative permittivity with real part equal (or substantially similar) to that of the material 142 and with its imaginary part having opposite sign as that of the strip material 100. For example, the strip may be bounded by $SiO_2$ on the bottom with a laser dye solution with a real permittivity matched to $SiO_2$ serving as the gain medium 140. Materials bounding the strip 100 may be referred to generally as a casing that surrounds the strip 100. The material 142 is bounded on the bottom by a substrate 146 and the gain medium 140 is bounded on the top by a cover 144; both materials 146 and 144 preferably having relative permittivities with real parts larger than those of materials 142 and 140 so they serve as cladding-mode stripers. Given these constraints, it is envisioned that the waveguide can be fabricated from many materials, enabling designs with optimal gain and noise properties.

In this first exemplary embodiment, the waveguide structure 150 incorporates a fluidic channel 44 as the means to confine the fluid gain medium in the device and to enable the fluid circulation if so required. The fluidic channel has a width $W_G$, a thickness $t_G$, and a length $l_G$, that define dimensions of the gain medium, and incorporates holes 40 and 42 that serve as inlet and outlet for the fluid gain medium. The inlet and outlet holes have diameters $W_H$ and are connected to fluidic elements (e.g., 30) that carry the fluid gain medium in an external loop incorporating a fluidic pump. The inlet and outlet holes have diameters $w_H$ which are selected according to the viscosity of the fluid gain medium and the width $W_G$. The lateral materials 148a and 148b defining the walls of the fluidic channel must be transparent to the optical radiation generated by the pump source. Examples of gain media include (but are not limited to) laser dyes molecules in solution and atomic gain media in gaseous state.

The optical pumping means consists of two pump sources 200 and 202 providing optical energy suitable for pumping the fluid gain medium of interest, and two pump interfacing element 300 and 302 for channeling the pump source's energy into such a gain medium. The optical pump sources can include (but are not limited to) coherent sources of optical radiation (i.e., lasers of any type), and incoherent sources of optical radiation such as flash lamps, and high power semiconductor light-emitting diodes and diode arrays. The pump interfacing elements can comprise a single lens or lens system suitable of concentrating the pump's energy in a predetermined region of the gain medium according to a particular amplifier design in order to pump efficiently the gain medium Operation of the amplifier 400 is as follows. An optical radiation signal (possibly) carrying information and with central optical wavelength falling within the gain spectrum of the plasmon-polariton amplifier 400 is supplied to the amplifier's input port 10. The input port 10 delivers the optical radiation to a mode-matching element 20, which couples the optical radiation with high efficiency into the waveguide structure 150 at input port 120. The coupled optical radiation excites a plasmon-polariton wave that propagates along the length of the waveguide. As the plasmon-polariton wave propagates, it interacts with the gain medium and undergoes optical amplification. At an output port 122, the amplified plasmon-polariton wave is extracted from the waveguide structure 150 via a mode-matching element 22, which couples with high efficiency the plasmon-polariton mode at the output to the mode supported by the output coupling 12. A similar principle of operation applies for the other embodiments described below.

Figure 4:
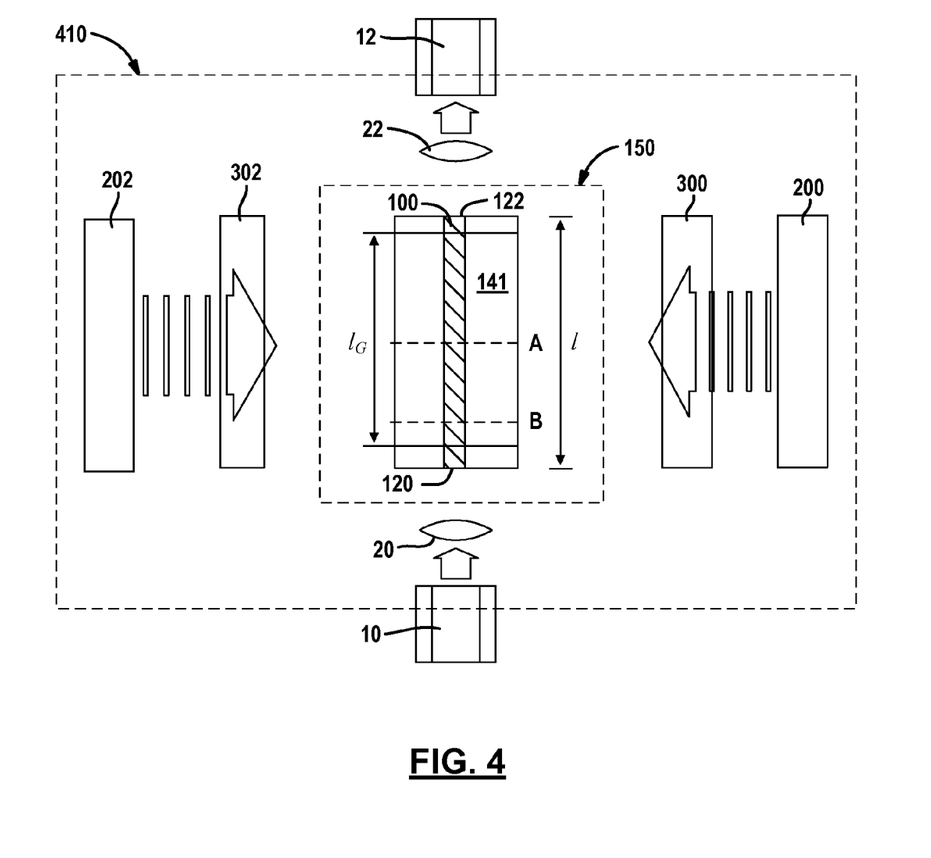
FIG. 4 is a diagram depicting a second exemplary embodiment of a plasmon-polariton amplifier in which the gain medium is a solid pumped optically.
Figure 5A:
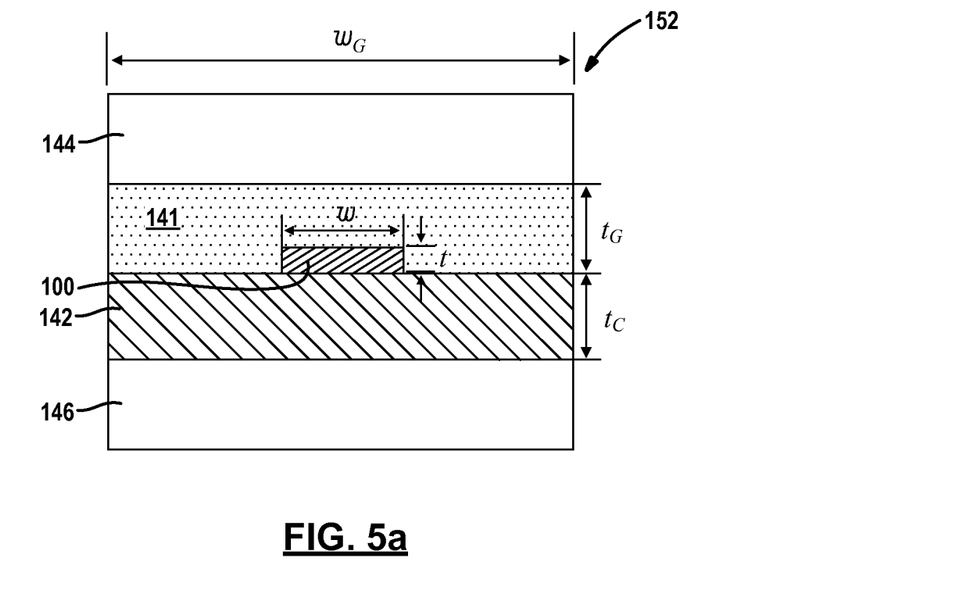
FIG. 5a is a cross-sectional view of the amplifier taken along transverse cut A as specified in FIG. 4 for the case where the gain medium bounds the top and sides of the strip.
Figure 5B:
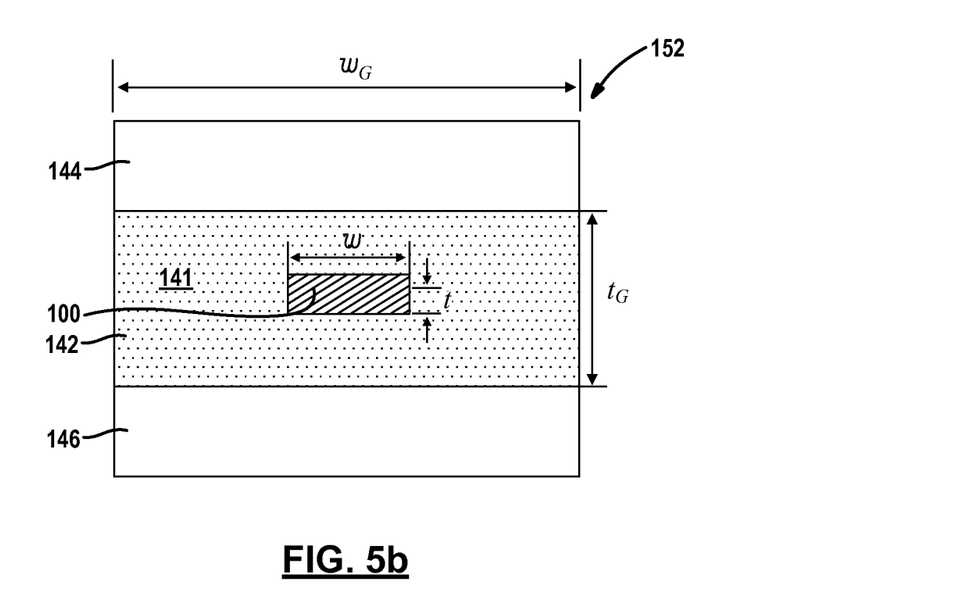
FIG. 5b is a cross-sectional view of the amplifier taken along transverse cut A as specified in FIG. 4 for the case where the gain medium entirely surrounds the strip.

FIGS. 4, 5a and 5b depict a second exemplary embodiment of an optical amplifier 410. This embodiment is similar to the plasmon-polariton amplifier 400 presented in the first embodiment except that the gain medium 141 is a solid medium. Thus, for the second embodiment of this disclosure, it suffices to describe the waveguide structure 152 and omit other components described above in relation to the first embodiment.

As shown in FIG. 5a, the waveguide structure 152 comprises a strip 100, as in the first embodiment of this disclosure, bounded on the bottom by a material 142 having a (possibly) complex relative permittivity with positive real part, and bounded on the top and sides by a solid gain medium 141 having a complex relative permittivity with real part substantially similar to that of the material 142 and with its imaginary part having opposite sign as that of the strip material 100. The material 142 is bounded on the bottom by a substrate 146. The gain medium 141 is bounded on the top by a cover 144. Both materials, 146 and 144, should have preferably relative permittivities with real parts larger than those of materials 142 and 141.

Alternatively, the strip 100 may be surrounded entirely by the gain medium 141 as shown in FIG. 5B. This configuration essentially doubles the amplifier gain and is extremely useful in designs where the gain medium provides limited optical gain. Examples of solid gain media include (but are not limited to) polymers or glasses doped with quantum dots, polymers or glasses doped with laser dye molecules, rare-earth ion doped glasses, and semiconductor quantum wells, wires or dots. While various embodiments are shown with the gain medium adjacent to the strip along three or four sides, it is envisioned that gain medium may be adjacent to the strip along one or two sides in other embodiments.

Figure 6:
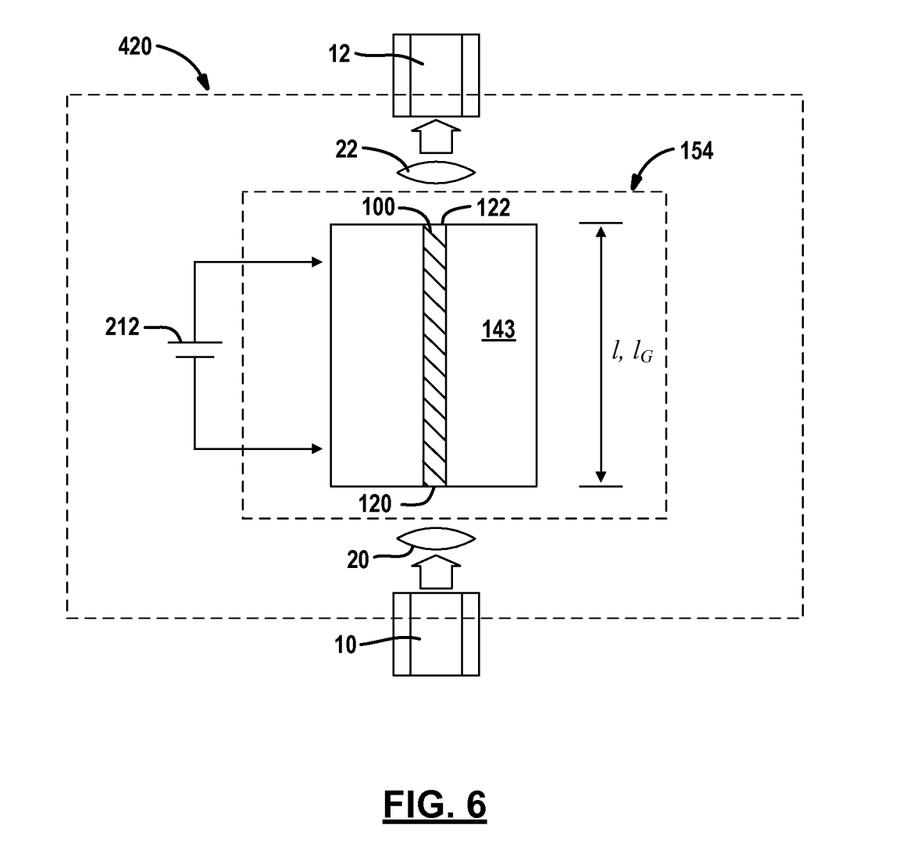
FIG. 6 is a diagram depicting a third exemplary embodiment of the plasmon-polariton amplifier in which the gain medium is formed by electrically pumped semiconductor quantum wells.
Figure 7:
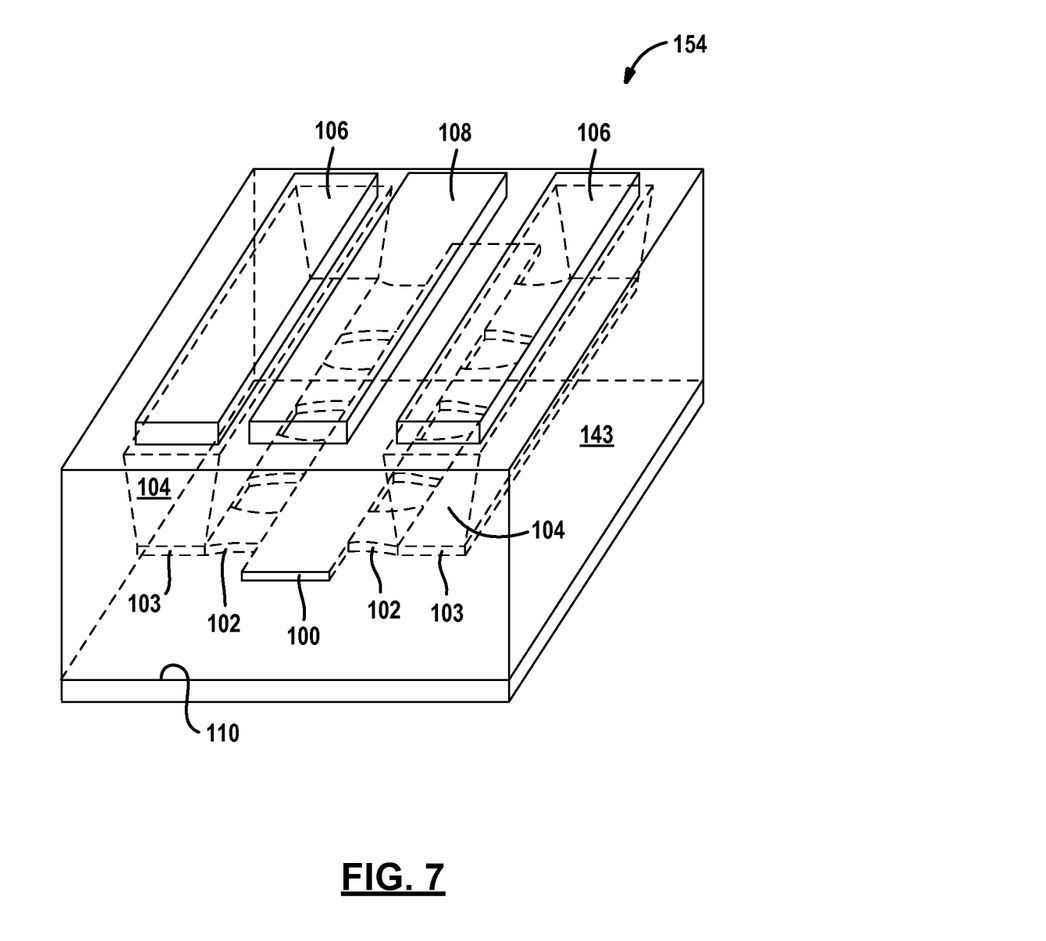
FIG. 7 is a schematic perspective view of the third embodiment of the plasmon-polariton amplifier with an exemplary electrode configuration.
Figure 8:
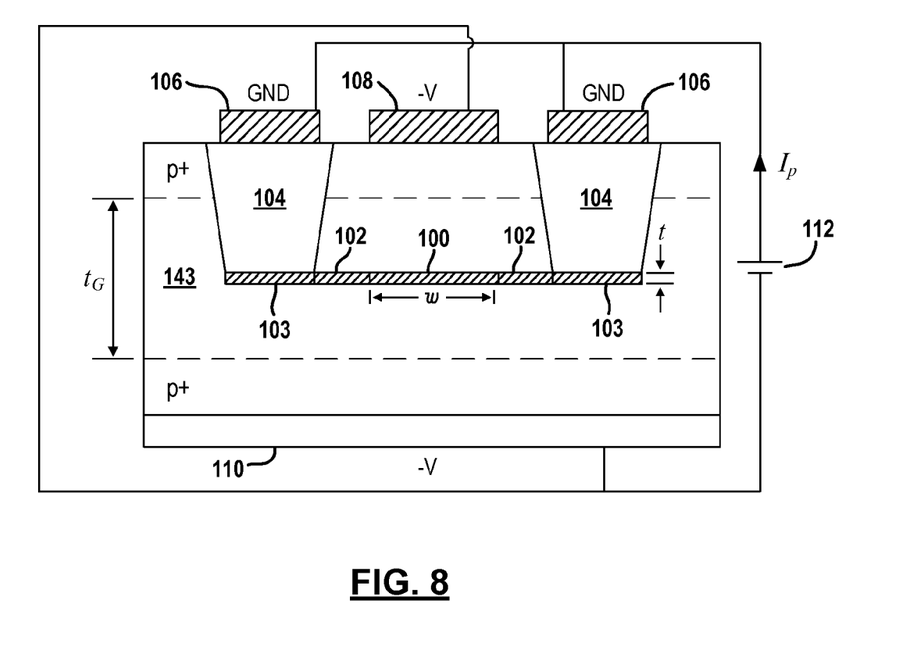
FIG. 8 is a cross-sectional view of the plasmon-polariton amplifier in FIG. 7.

FIGS. 6-8 depict a third exemplary embodiment of an optical amplifier 420. This embodiment differs from previous embodiments in that the gain medium 143 consists of an electrically pumped semiconductor medium. The plasmon-polariton amplifier 420 has similar input and output couplings 10/12 and input and output mode-matching elements, 20/22, as in the first and second embodiments of this disclosure.

The plasmon-polariton amplifier 420 includes a waveguide structure 154 and an electric pump source 112 (i.e., a voltage source), which pumps the gain medium 143 by means of current injection (the ohmic contacts for current injection into the gain medium are shown in FIGS. 7 and 8). The waveguide structure 154 includes a strip 100 embedded in a semiconductor gain medium 143 incorporating electrodes and contacts that connect to the electric pump source 112 in order to pump (i.e., excite) the gain medium 143.

FIGS. 7 and 8 show the waveguide structure 154 with an exemplary electrode configuration, which by no means is the only configuration possible within the scope of the present disclosure. The electrode configuration comprises two ohmic contacts to the semiconductor: one contact 110 on the bottom and the other contact 108 on the top. The bottom ohmic contact runs the length and width of the device; whereas the top ohmic contact 108 runs the length of the device but is narrower in width than the device allowing room for the contacts to the strip 100 but stopping short at each end.

The electrode configuration also comprises electrical contacts 102, 103, 104, 106 connecting the strip 100 on either side. Electrical access to the strip is enabled through the contacts 106 on the top of the device, connected to contact portions 103 by vias 104, in the form of trenches running almost the length of the semiconductor body 143. The contact portions 103 are connected to the strip 100 by contact fingers 102 as illustrated in FIGS. 7 and 8. The electrical contacts to the waveguide comprise contacts/electrodes on the top of the device 106, which connects to contacts at the waveguide level 103 through vias 104. The contacts at the waveguide level 103 make contact to the stripe 100 through optically non-invasive contact fingers 102.

The semiconductor gain medium consists of a bulk, quantum well, quantum wire or quantum dot medium 143 distributed over a region of thickness $t_G$ surrounding the strip 100; whereas, the portions near to the electrodes 106, 108 and 110, are heavily doped semiconductor regions made of the same material as the quantum well barrier material. FIG. 8 shows how to bias gain medium 143 when a p-type dopant is used. The polarity of the electric pump source 112 must be inverted in order to bias the gain medium 143 when an n-type dopant is used. III-V or II-VI direct bandgap semiconductor materials are suitable as the gain medium although other types of semiconductor materials are also contemplated by this disclosure.

The architectures of plasmon-polariton amplifiers 400, 410, and 420 presented in the previous embodiments may be employed to construct a plasmon-polariton based laser by incorporating any of said plasmon-polariton amplifiers into a resonant cavity of length $l_R$ supporting at least one longitudinal mode with a wavelength that overlaps efficiently with the plasmon-polariton amplifier's gain spectrum, such that the gain provided by the plasmon-polariton amplifier is larger than the losses of the resonant cavity. In such a case, the device becomes a source of highly polarized optical radiation.

Figure 9:
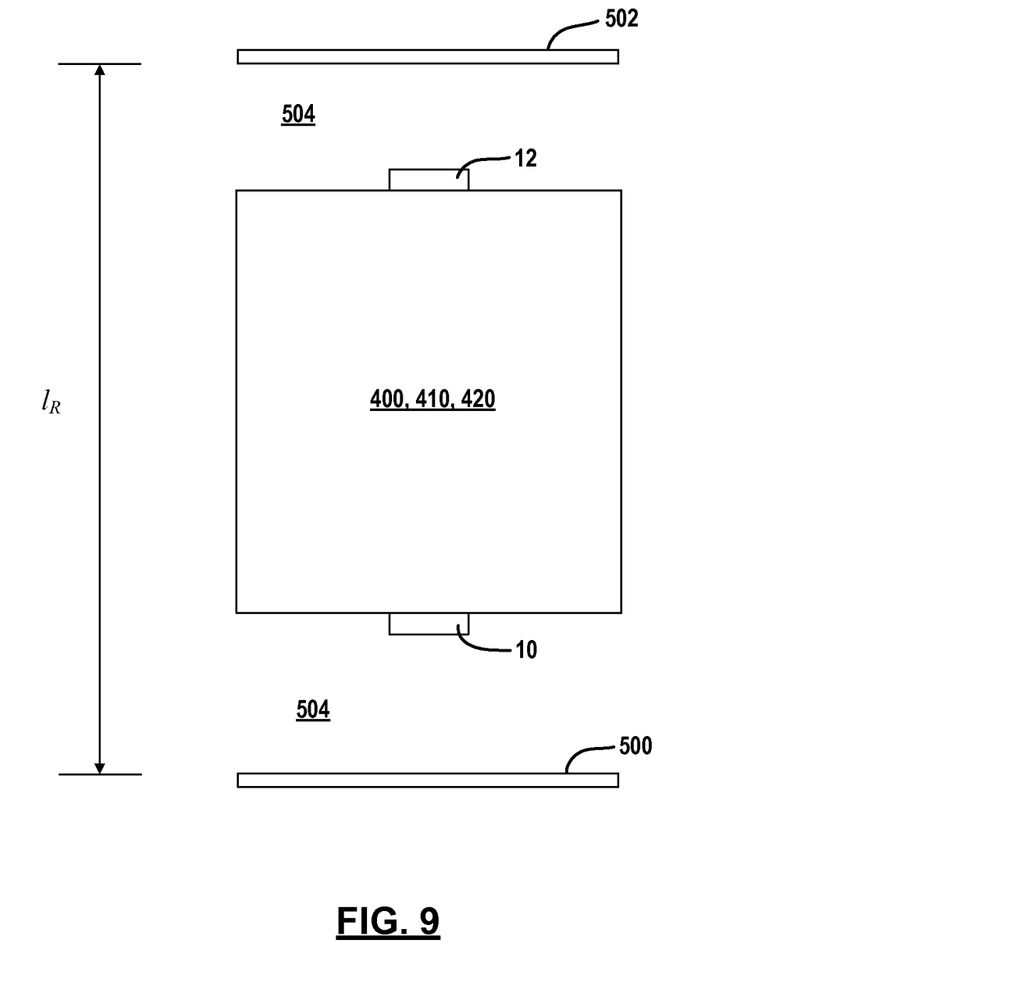
FIG. 9 is a diagram illustrating a possible architecture of a plasmon-polariton based laser.

An architecture for the plasmon-polariton laser is depicted in FIG. 9, where resonant cavity of length $l_R$ is formed by two reflectors, 500 and 502, separated by the cavity medium 504 (i.e., a Fabry-Perot cavity), with at least one of the reflectors being a partially transmitting reflector (i.e., having a reflectivity less than one). The cavity medium 504 can be any material substantially transparent at the wavelength of the optical radiation of interest. The cavity medium hosts one of the plasmon-polariton architectures 400, 410, and 420 (or suitable variants thereof). The reflectors 500 and 502 may take the form of dielectric mirrors, metallic mirrors, Bragg mirrors, abrupt medium discontinuities, or any other sort of reflector capable of reflecting partially or entirely the optical radiation.

It must be noted that the Fabry-Perot configuration exemplifying the plasmon-polariton based laser in FIG. 9 is by no means is the only configuration possible within the scope of the present disclosure. For example, a resonant cavity can be enabled in architectures employing fiber Bragg gratings or waveguide Bragg gratings attached to the input port 10 and output port 12 of the plasmon-polariton amplifier. Yet another architecture could employ a plasmon-polariton grating instead of the strip 100 as the means to guide a plasmon-polariton in the plasmon-polariton amplifier enabling a distributed feed-back (DFB) type plasmon-polariton laser. Jetté et al. disclosed plasmon-polariton gratings and its use in external cavity lasers in U.S. Pat. No. 7,151,789 B2 issued Dec. 19, 2006, the contents of which are incorporated herein by reference and to which the reader is directed for reference.

It should be noted that the design of the strip 100, its thickness t, width w and material composition, are selected such that the waveguide structure 150,152,154 supports a plasmon-polariton mode at a free-space operating wavelength that overlaps efficiently with the gain spectrum of the gain medium 140, 141, 143.

It should be noted that the dimensions of the gain medium 140, 141, 143, namely its width $w_G$, thickness $t_G$, and length $l_G$, are defined based on the properties of the gain medium and on specific requirements of an amplifier design. In particular, the width $w_G$ and thickness $t_G$ are selected such that the gain medium 140, 141, 143 overlaps efficiently with the plasmon-polariton mode supported by the waveguide and that most of the energy provided by the pumps is transferred to the gain medium such that a strong population inversion is achieved in a region that overlaps efficiently with said plasmon-polariton mode; the length $l_G$ is selected for best convenience according to a specific amplifier design, preferably covering as much as possible the length of the waveguide structure 150,152,154 to reduce optical losses in the passive section of the waveguide.

Figure 10A:
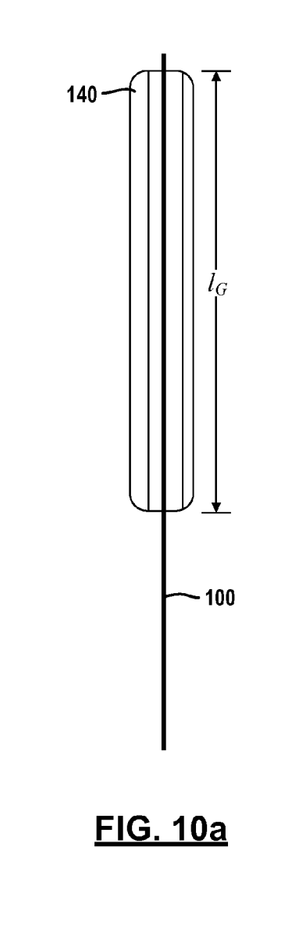
FIGS. 10a-10d are diagrams illustrating different stripe designs that could be employed in a plasmon-polariton amplifier.

In the exemplary embodiments above, the strip 100 has a shape of a rectangular cuboid. It should be noted that the design of the strip 100 in the plasmon-polariton amplifiers described in the embodiments of the present disclosure are not restricted to this particular shape nor to being straight as in FIG. 10a, but can incorporate bends of different kinds, such as those depicted in FIG. 10b-d. Plasmon-polariton strips incorporating similar bends have been disclosed by Charbonneau et al. in "Passive integrated optics elements used on long-range surface plasmon polaritons," J. Lightwave Technol vol. 24, 477 (2006)", the contents of which are incorporated herein by reference and to which the reader is directed for reference. It is contemplated that other geometric shapes for the strip fall within the broader aspects of this disclosure.

It should be noted that, embodiments employing optical pump sources are not limited to having the pump optical radiation impinging onto the side faces of the gain medium, but can also include pumping from the top and/or bottom with the pump optical radiation impinging onto the gain medium at normal or oblique incidence.

In what follows various design implementations are described and their noise and gain performance evaluated through theoretical and/or experimental analyses. The examples are Gaussian-like plasmon-polariton amplifiers; i.e., the amplifier supports a plasmon-polariton mode with a Gaussian-like intensity distribution along the width of the stripe and that concentrates substantially its field close to the stripe. Thus, the noise theory of plasmon-polariton amplifiers presented earlier applies and is used to obtain the optical noise figure of the suggested systems.

A first design example of the plasmon-polariton amplifier follows the architecture depicted in FIGS. 2, 3a and 3b, where the strip 100 is made out of gold (Au) having width w=1 μm and thickness t=20 nm, the bottom bounding material 140 and the material 148a and 148b forming fluid channel walls is silicon dioxide (SiO$_2$) with the bottom bounding material being $t_X$=15 μm thick, the substrate material 146 is silicon (Si), the cover material 144 is glass, and the gain medium consists of optically pumped IR140 laser dye molecules dissolved in a mixture of 30.4% ethylene glycol and 69.6% dimethyl sulphide, which emit strongly at infrared wavelengths around 880 nm. The solvent mixture was selected to have the real part of the gain medium's permittivity matched to that of SiO$_2$ at temperatures close to room temperature. The thickness and width of the gain medium are $t_G$=90 μm $w_G$=150 μm.

For this particular configuration and operation wavelength, commercially available polarization maintaining fibers support modes well matched to the mode supported by the plasmon-polariton waveguide. Thus, the mode-matching elements 20/22 can be removed by using polarization maintaining fibers as the input and output couplings 10/12 butt-coupled directly to the input and output ports of the plasmon-polariton amplifier.

A plasmon-polariton amplifier similar to that suggested in this design example was fabricated and tested to prove the principle of operation and to measure its gain and noise characteristics. To simplify the fabrication and testing process, the plasmon-polariton amplifier was pumped using a pulsed laser beam incident from the top of the structure (i.e., impinging onto the glass cover) rather than from the sides, as indicated in FIG. 2. The variation in the pump arrangement does not affect in any way the conclusions applied to the specific pump arrangement indicated in FIG. 2.

Figure 11A:
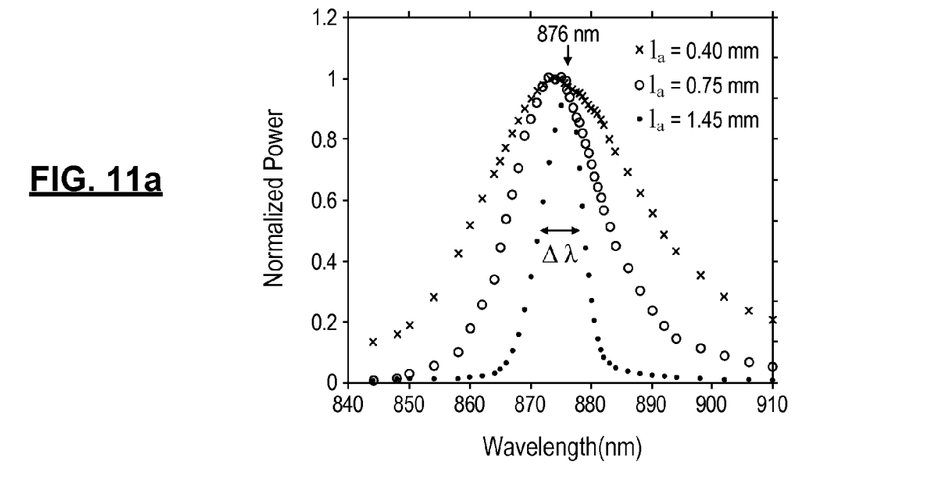
FIG. 11a is a graph showing ASE spectra measured in the first embodiment of the plasmon-polariton amplifier fabricated in close configuration.

FIG. 11a presents measurements of ASE in the fabricated plasmon-polariton amplifier using a 0.5 mM concentration of IR140 molecules. The measurements were obtained by varying the amplifier length and keeping constant peak pump intensity of 1.25 MW/cm$^2$. From the ASE measurements one can observe that the gain spectrum of the plasmon-polariton amplifier peak at a wavelength of $\lambda_o$=876 nm; yet the peak may vary with the molecular concentration.

Figure 11B:
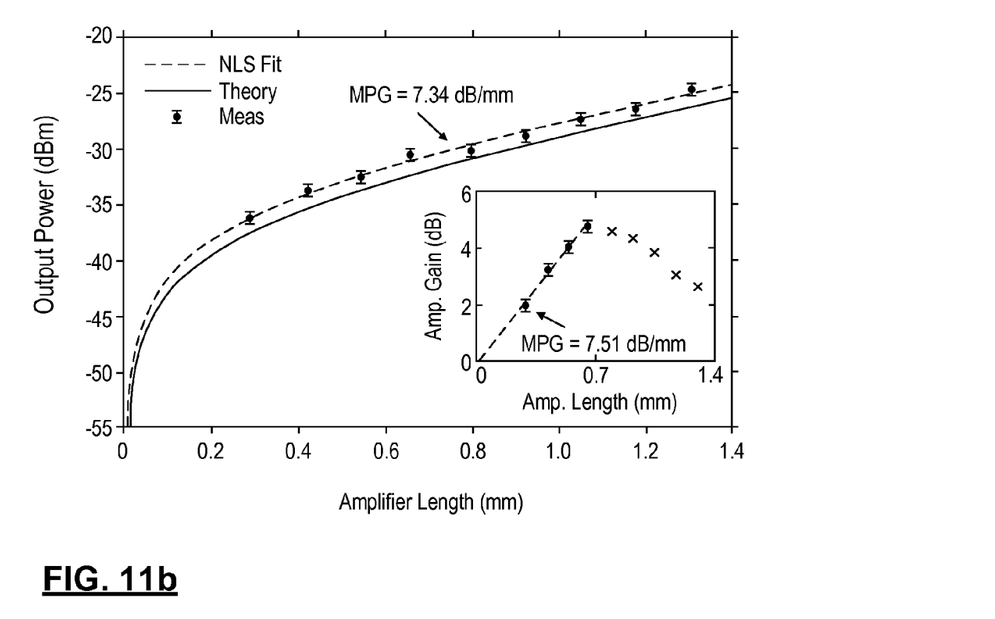
FIG. 11b is a graph showing ASE and gain measured at a wavelength of 876 nm in the first embodiment of the plasmon-polariton amplifier fabricated in close configuration.

The main plot in FIG. 11b shows measurements of power at the output of the plasmon-polariton amplifier in the absence of an input signal for several amplifier lengths (several values of $l_G$). The measurements were taken at a central wavelength $\lambda_0$ over a bandwidth of $B_\lambda$=1.2 nm (which corresponds to $B_\nu$=0.468 THz), which is very narrow compared to the emission spectrum of the IR140 molecule. Thus, the measurements indicate the evolution of the ASE power at the wavelength $\lambda_o$ as a function of the amplifier length. The inset in FIG. 11b shows measurements of the plasmon-polariton amplifier's gain as a function of the amplifier length obtained by feeding a (practically) monochromatic input signal of wavelength $\lambda_0$ and measuring the ratio of the output signal power to the input signal power.

By fitting the ASE measurements in FIG. 11b to Equation (4) in the theory section, one can quantify the equivalent input noise power ($P_N$) and mode power gain (MPG) of the plasmon-polariton amplifier, which yields $P_N$=0.37 μW and MPG=10 $\log_{10}(e)\gamma$=7.34 dB/mm. On the other hand, the amplifier gain measurements using an input signal in the inset of FIG. 11b quantify directly the MPG as the slope of a linear model fitted to the linear region of the measurements, and provides a method to validate the MPG calculated using the ASE measurements. The measurements of the amplifier's gain using an input signal yielded MPG=7.51 dB/mm, which is in good agreement with the value obtained from ASE measurements. Thus, it may be concluded that the measured value of $P_N$ represents fairly the amplifier's equivalent input noise power.

Figure 10B:
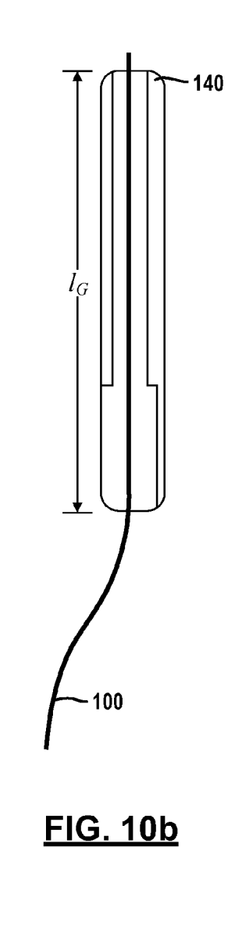
Figure 10C:
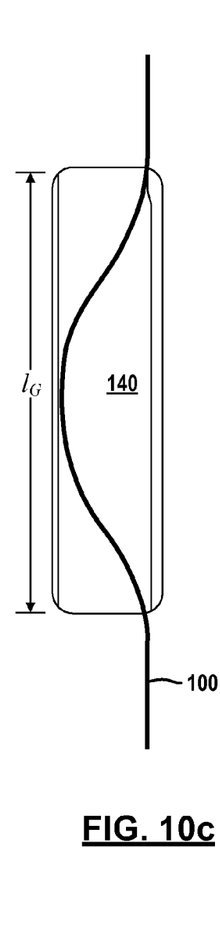
Figure 10D:
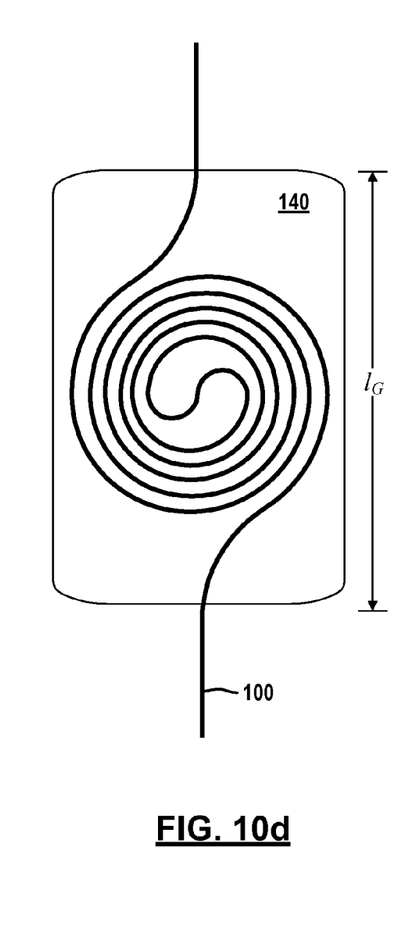

Using measured values for the MPG and intrinsic mode power attenuation (MPA) of the waveguide structure (in the absence of IR140 molecules), MPA=10 $\log_{10}(e)\alpha$=5.3 dB/mm, in Equations (21) and (22) to obtain the noise figure of the plasmon-polariton amplifier, yields $F_o$=4.4. The noise figure obtained directly from the measured value of $P_N$ was $F_o$=6.6. The discrepancy is attributed to coupling of background ASE radiation (ASE not guided by the strip 100) into the output PM fiber. However, this unwanted background ASE radiation, can be mitigated by limiting the gain medium cross-sectional area ($t_G$ and $W_G$) to a smaller area confined to the area where the plasmon-polariton mode exists (for the tested design the cross-sectional area of the gain medium was around 2500 times larger than the mode size); this also would reduce greatly the pump power required to achieve high gain. Another possibility to diminish the effect of the background ASE radiation is offsetting the strip 100 away from the ASE background radiation path near the waveguide's output port by bending the strip 100 as shown in FIGS. 10b and 10c.

A suitable concentration of IR140 molecules for achieving a noise figure better than $F_o$=4.5 ranges approximately from 0.1 mM to 5 mM, depending on the strip 100 dimensions and composition.

Another design example follows the architecture depicted in FIGS. 2, 3a and 3b, where the strip 100 is made of Ag with dimensions w=2 μm and t=10 nm, the bottom bounding material 140 and the material 148a and 148b forming fluid channel walls are CYTOP (a lossless polymer), the substrate material 246 is Si, the cover material 144 is BK7 glass, and the gain medium consists of optically pumped Rhodamine 6G (R6G) laser dye molecules dissolved in a mixture of 43% ethanol and 57% methanol. The solvent mixture was selected to have a gain medium with the real part of permittivity matched to that of CYTOP at temperatures close to room temperature. The gain medium provides maximum gain at the wavelength $\lambda_0$=560 nm. It is assumed that the input signal is monochromatic with central wavelength $\lambda_0$, that the input and output means 10/12 are commercially available PM fibers, and that the mode-matching elements 20/22 are lens systems. The thickness and width of the gain medium are $t_G=w_G$=5 μm. The optical pumps 200/202 can be single (or arrays of) high power semiconductor diode lasers emitting at 532 nm, which is close to the peak absorption wavelength of R6G, and the pump interfacing means 300/302 are systems of cylindrical lenses that generate well collimated beams impinging onto either side of the gain medium and with the pump beam dimensions filling the gain medium thickness and covering a length $I_G$ along the longitudinal axis of the waveguide structure.

To estimate the gain of the plasmon-polariton amplifier suggested in this design example, the model developed by De Leon and Berini was followed, who studied the one-dimensional variant of the plasmon-polariton amplifier with R6G-based gain medium in "Modeling surface plasmon-polariton gain in planar metallic structures" [Optics Express, vol. 17, p. 20191 (2009)] and "Theory of surface plasmon-polariton amplification in planar structures incorporating dipolar gain media" [Physical Review B vol. 78, p. 161401 (2008)], the contents of which are incorporated herein by reference.

For the calculations, a moderate concentration of R6G molecules of 5 mM is used, corresponding to a molecular density of $3\times10^{18}$ cm$^{-3}$, and the photophysical parameters of R6G and material parameters of the structure as given in "Modeling surface plasmon-polariton gain in planar metallic structures" [Optics Express, vol. 17, p. 20191 (2009)]. Furthermore, the combined optical intensity of the two pump sources is taken as 200 kW/cm$^2$, which is a conservative value, and is assumed constant over the entire gain medium. The simulation results are listed in Table 1 under the ID number 2.

A suitable concentration of IR140 molecules for achieving a noise figure better than $F_o$=4.5 ranges approximately from 3 mM to 40 mM, depending on the strip 100 dimensions and composition.

Yet another design example follows the architecture depicted in FIGS. 4 and 5b with an Ag strip 100, of width w=10 μm and thickness t=10 nm, embedded in the center of a gain medium 141 with thickness and width $t_G=w_G$=40 μm consisting of a phosphate glass co-doped with erbium and ytterbium ions, and having a Si substrate 246 and cover 144. The gain medium provides maximum gain at the wavelength $\lambda_0$=1535 nm and is widely used in telecommunication applications. It is assumed that the input signal is monochromatic with central wavelength $\lambda_0$, that the input and output couplings 10/12 are commercially available PM fibers, and that the mode-matching elements 20/22 are lens systems. The optical pumps 200/202 can be single (or arrays of) high power semiconductor diode lasers emitting at a wavelength of 980 nm, which close to the peak absorption wavelength of ytterbium, and the pump interfacing means 300/302 are systems of cylindrical lenses that generate a well collimated beams impinging onto either side of the gain medium and with the pump beam dimensions filling the gain medium thickness and covering a length $I_G$ along the longitudinal axis of the waveguide structure.

To model the gain of the plasmon-polariton amplifier suggested in this design example, the same technique is used to model the plasmon-polariton amplifier with R6G-based gain medium. However, for this case, the model is adapted to describe correctly the atomic transitions of the co-doped erbium-ytterbium system following the theory reported by Taccheo et al. in "Diode-pumped bulk erbium-ytterbium lasers"[Applied Physics B vol. 63, p. 425 (1996)], which accounts for cooperative up-conversion effects observed at high pump powers that limit the gain of the medium, and using the photophysical properties of a commercially available co-doped erbium-ytterbium phosphate glass (i.e., Kigre Inc., MM2 laser glass).

The dopant concentrations are 4.7 wt % and 7.2 wt % (ion densities $4\times10^{20}$ cm$^{-3}$ and $6\times10^{20}$ cm$^{-3}$) for erbium and ytterbium, respectively. The combined optical power of the two pump sources is taken as 10 kW/cm2 and is assumed constant over the entire gain medium. The simulation results are listed in Table 1 below under the ID number 3.

TABLE 1

| ID | Strip Mat./t/w | Gain medium [concentration] | Pump (kW/cm$^2$) | $\lambda_0$ (nm) | MPA (dB/mm) | MPG (dB/mm) | $F_o$ |
|---|---|---|---|---|---|---|---|
| 1 | Au/20 nm/ 1 μm | 140 dye (fluid), [0.5 mM] | 1250 | 876 | 5.3* | 7.5* | 4.4 |
| 2 | Ag/10 nm/ 2 μm | R6G dye (fluid), [5 mM] | 200 | 560 | 9.96 | 34.6 | 3.3 |
| 3 | Ag/10 nm/ 10 μm | Er$^{+3}$/Yb$^{+3}$: Glass, [4.7 wt %/ 7.2 wt %] | 10 | 1534 | 0.18 | 1.06 | 2.9 |

Gain and noise properties calculated and/or measured for the design examples described above,
*indicates a measured value.

Note that the calculated MPA and MPG values were obtained assuming w=∞ by using the one-dimensional model described in "Modeling surface plasmon-polariton gain in planar metallic structures" [Optics Express, vol. 17, p. 20191 (2009)]. Since the losses of plasmon-polariton waves supported by infinitely wide strips are always larger than the losses of those waves supported by a finite width strip, the one-dimensional model yields the minimum gain achievable by a plasmon-polariton waveguide of finite width. Thus, the calculated MPGs and noise figures are conservative values. Also, note that the plasmon-polariton amplifiers presented herein exhibit high gains and low noise properties, with noise figure better than 4.5, over a wide range of wavelengths that span the visible and infrared spectrum.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An optical amplifier suitable for amplifying optical radiation in the form of plasmon-polariton waves, comprising:
an input coupling configured to receive an optical signal having a wavelength in a predetermined range;
an optical waveguide having one end optically coupled to the input coupling, the optical waveguide includes
a strip comprised of a material having a complex relative permittivity with a negative real part and dimensioned such that optical radiation of the optical signal couples to the strip and propagates along length of the strip as a plasmon-polariton wave; and
a casing surrounding the strip and comprised of material having a complex relative permittivity with positive real part, a portion of the casing adjacent to at least one longitudinal surface of the strip and operating as a gain medium to amplify the plasmon-polariton wave propagating along the strip; and
an output coupling optically coupled to the optical waveguide and configured to receive the amplified plasmon-polariton wave from the strip.

2. The optical amplifier of claim 1 wherein width of the strip is dimensioned same as thickness of the strip.

3. The optical amplifier of claim 2 wherein the portion of the casing operating as a gain medium is adjacent to a top longitudinal surface and two side longitudinal surfaces of the strip.

4. The optical amplifier of claim 1 wherein the gain medium is a fluid.

5. The optical amplifier of claim 4 further comprises at least one pump source configured to apply optical energy to the gain medium.

6. The optical amplifier of claim 1 wherein the strip is bounded on a bottom longitudinal surface by a boundary material having a complex relative permittivity with an imaginary part having a sign opposite the strip material.

7. The optical amplifier of claim 6 wherein the boundary material is bounded on a bottom surface by a substrate, the substrate having relative permittivity with real part larger than the relative permittivity of the boundary material.

8. The optical amplifier of claim 6 wherein the gain medium is bounded on a top surface by a cover material, the cover material having relative permittivity with real part larger than the relative permittivity of the gain medium.

9. The optical amplifier of claim 1 wherein the gain medium is adjacent to each of the longitudinal surfaces of the strip.

10. The optical amplifier of claim 1 wherein the gain medium is a solid material.

11. The optical amplifier of claim 10 further comprises at least one pump source configured to apply energy to the gain medium.

12. The optical amplifier of claim 11 wherein the pump energy is electrical.

13. The optical amplifier of claim 1 wherein the strip is comprised of a metal material and dimensioned with a width that effects the operation of the waveguide, wherein the strip is bounded along a bottom longitudinal surface of the strip by a dielectric material, such that optical radiation of the optical signal couples to the strip and propagates along length of the strip as a plasmon-polariton wave.

14. The optical amplifier of claim 13 wherein the strip is a rectangular cuboid and the gain medium is adjacent to a top longitudinal surface of the strip and two side longitudinal surfaces of the strip.

15. The optical amplifier of claim 14 wherein the gain medium is a laser dye solution with a real permittivity matched to the dielectric material.

16. The optical amplifier of claim 15 further comprises at least one pump source configured to apply optical energy to the gain medium.

17. The optical amplifier of claim 13 wherein the dielectric material having a complex relative permittivity with an imaginary part having a sign opposite the strip material.

18. The optical amplifier of claim 17 wherein the dielectric material is bounded on a bottom surface by a substrate, the substrate having relative permittivity with real parts larger than the relative permittivity of the dielectric material.

19. The optical amplifier of claim 18 wherein the gain medium is bounded on a top surface by a cover material, the cover material having relative permittivity with real parts larger than the relative permittivity of the gain medium.

20. The optical amplifier of claim 13 wherein the gain medium is adjacent to each of the longitudinal surfaces of the strip.

21. The optical amplifier of claim 13 wherein the gain medium is a solid semiconductor material.

22. The optical amplifier of claim 21 further comprises at least one pump source configured to inject a current into the gain medium.

23. A plasmon-polariton laser, comprising:
a resonant cavity;
a plasmon-polariton amplifier integrated into the resonant cavity, the resonant cavity supporting at least one longitudinal mode with a wavelength that overlaps gain spectrum of the amplifier, wherein the amplifier is comprised of
an input coupling configured to receive an optical signal;
an optical waveguide having one end optically coupled to the input coupling, the optical waveguide includes
a strip comprised of a material having a complex relative permittivity with a negative real part and dimensioned such that optical radiation of the optical signal couples to the strip and propagates along length of the strip as a plasmon-polariton wave; and
a casing surrounding the strip and comprised of material having a complex relative permittivity with positive real part, a portion of the casing adjacent to at least one longitudinal surface of the strip and operating as a gain medium to amplify the plasmon-polariton wave propagating along the strip; and
an output coupling optically coupled to the optical waveguide and configured to receive the amplified plasmon-polariton wave from the strip.

* * * * *